(12) United States Patent
Hong

(10) Patent No.: US 12,738,954 B2
(45) **Date of Patent: *Sep. 15, 2026**

(54) DIGITAL-TO-ANALOG CONVERTER, MANUFACTURING METHOD THEREOF, AND SUCCESSIVE APPROXIMATION REGISTER ANALOG-TO-DIGITAL CONVERTER

(71) Applicant: Realtek Semiconductor Corporation, Hsinchu (TW)

(72) Inventor: Wei-Cian Hong, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 136 days.

This patent is subject to a terminal disclaimer.

(21) Appl. No.: 18/780,513

(22) Filed: Jul. 23, 2024

(65) Prior Publication Data

US 2025/0175188 A1 May 29, 2025

(30) Foreign Application Priority Data

Nov. 28, 2023 (TW) ................................ 112146145

(51) Int. Cl.
*H03M 1/46* (2006.01)

(52) U.S. Cl.
CPC .................................. *H03M 1/466* (2013.01)

(58) Field of Classification Search
CPC ............................. H03M 1/466; H03M 1/468
See application file for complete search history.

(56) References Cited

U.S. PATENT DOCUMENTS

| | | | | |
|---|---|---|---|---|
| 6,124,818 | A * | 9/2000 | Thomas | H03M 1/164 341/161 |
| 9,154,151 | B1 * | 10/2015 | Leong | H03M 1/182 |
| 9,774,345 | B1 * | 9/2017 | Yoshioka | H03M 1/0854 |
| 10,075,178 | B1 * | 9/2018 | Yang | H03M 1/1028 |
| 10,218,376 | B1 * | 2/2019 | Collins | H03M 1/0641 |
| 10,742,225 | B1 * | 8/2020 | Molina | H04B 1/16 |
| 10,770,457 | B2 * | 9/2020 | Jones, III | H10D 1/042 |
| 11,101,814 | B2 * | 8/2021 | Chiang | H03M 1/0692 |
| 2011/0304493 | A1 * | 12/2011 | Mitikiri | H03M 1/462 341/150 |
| 2014/0167992 | A1 * | 6/2014 | Aruga | H03M 1/12 361/303 |

(Continued)

*Primary Examiner* — Lam T Mai

(74) *Attorney, Agent, or Firm* — CKC & Partners Co., LLC

(57) ABSTRACT

A capacitive digital-to-analog converter (CDAC) comprising a capacitive structure and a control logic circuit coupled to each other is provided. Two terminals of the capacitive structure respectively receive positive and negative reference voltages. The control logic circuit comprises switch groups that each comprises first and second switch circuits. The first and second switch circuits each comprise first, second terminals and a control terminal. The first terminals of the first and second switch circuits respectively receive positive and negative reference voltages, through first and second shielding layers of the CDAC respectively. The second terminal is coupled to the capacitive structure. The control terminal receives one of turn-on signals through a first metal layer of the CDAC. The capacitive structure is located at least in a second metal layer of the CDAC. The first and second shielding layers are above the first metal layer and below the second metal layer.

20 Claims, 6 Drawing Sheets

(56) References Cited

U.S. PATENT DOCUMENTS

| | | | | |
|---|---|---|---|---|
| 2019/0190526 | A1* | 6/2019 | Iguchi | H03M 1/1245 |
| 2019/0196654 | A1* | 6/2019 | Jiang | G01R 27/2605 |
| 2020/0144253 | A1* | 5/2020 | Jones, III | H10D 1/042 |
| 2024/0178852 | A1* | 5/2024 | Wang | H03M 1/164 |
| 2024/0213999 | A1* | 6/2024 | Wu | H03M 1/0604 |
| 2024/0388302 | A1* | 11/2024 | Lin | H03M 1/0604 |
| 2025/0175187 | A1* | 5/2025 | Hong | H03M 1/462 |
| 2025/0226836 | A1* | 7/2025 | Huang | H03M 1/50 |
| 2025/0309912 | A1* | 10/2025 | Lin | H03M 1/462 |

* cited by examiner

DIGITAL-TO-ANALOG CONVERTER, MANUFACTURING METHOD THEREOF, AND SUCCESSIVE APPROXIMATION REGISTER ANALOG-TO-DIGITAL CONVERTER

RELATED APPLICATIONS

This application claims priority to Taiwan Application Serial Number 112146145, filed on Nov. 28, 2023, which is herein incorporated by reference in its entirety.

BACKGROUND

Technical Field

The present disclosure relates to capacitive digital-to-analog converter technologies. More particularly, the present disclosure relates to a capacitive digital-to-analog converter with a three-dimensional layout, a manufacturing method thereof and a successive approximation register analog-to-digital converter.

Description of Related Art

In today's analog-to-digital converter (ADC) field, the successive approximation register analog-to-digital converter (SAR ADC) has become one of the most commonly used ADCs due to its high conversion accuracy.

However, in the layout used by today's SAR ADCs, the capacitive digital-to-analog converter (CDAC) in the SAR ADC often occupies a large amount of area. This situation will not only increase the area of the SAR ADC, but the circuit signals of the routing inside the CDAC will also affect the operation of the capacitors. Therefore, how to alleviate the effect caused by CDAC's layout is one of the topics in this field.

SUMMARY

A capacitive digital-to-analog converter (CDAC) is provided in the present disclosure. The CDAC comprises a capacitive structure and a control logic circuit coupled to each other. Two terminals of the capacitive structure are configured to respectively receive a positive reference voltage and a negative reference voltage. The control logic circuit comprises a plurality of switch groups. Each of the plurality of switch groups comprises a first switch circuit and a second switch circuit. Each of the first switch circuit and the second switch circuit comprises a first terminal, a second terminal and a control terminal. The first terminal of the first switch circuit is configured to receive the positive reference voltage through a first shielding layer of the CDAC. The first terminal of the second switch circuit is configured to receive the negative reference voltage through a second shielding layer of the CDAC. The second terminal is configured to be coupled to the capacitive structure. The control terminal is configured to receive one of a plurality of turn-on signals through a first metal layer of the CDAC. The capacitive structure is located at least in a second metal layer of the CDAC. In a vertical direction, the first shielding layer and the second shielding layer are located above the first metal layer and below the second metal layer. The vertical direction is vertical to plane directions of the first metal layer, the second metal layer, the first shielding layer and the second shielding layer.

A manufacturing method for manufacturing a CDAC is provided in the present disclosure. The manufacturing method comprises: forming a control logic circuit comprising a plurality of switch groups; and forming a capacitive structure. The step of forming the control logic circuit comprising the plurality of switch groups comprises: forming a plurality of first switch circuits; and forming a plurality of second switch circuits. A first terminal of each of the plurality of first switch circuits is configured to receive a positive reference voltage through a first shielding layer of the CDAC, and a control terminal of each of the plurality of first switch circuits is configured to receive one of a plurality of turn-on signals through a first metal layer of the CDAC. A first terminal of each of the plurality of second switch circuits is configured to receive a negative reference voltage through a second shielding layer of the CDAC, and a control terminal of each of the plurality of second switch circuits is configured to receive another of the plurality of turn-on signals through the first metal layer. The capacitive structure is located at least in a second metal layer of the CDAC and coupled to a plurality of second terminals of the plurality of first switch circuits and the plurality of second switch circuits. Two terminals of the capacitive structure are configured to respectively receive the positive reference voltage and the negative reference voltage. In a vertical direction, the first shielding layer and the second shielding layer are located above the first metal layer and below the second metal layer, and the vertical direction is vertical to plane directions of the first metal layer, the second metal layer, the first shielding layer and the second shielding layer.

A successive approximation register analog-to-digital converter (SAR ADC) is provided in the present disclosure. The SAR ADC comprises a CDAC, a comparator and a logic decision circuit. The CDAC comprises a capacitive structure and a control logic circuit coupled to each other. Two terminals of the capacitive structure are configured to respectively receive a positive reference voltage and a negative reference voltage for sampling an input signal and generating a first signal and a second signal. The control logic circuit is configured to adjust the first signal and the second signal based on a plurality of turn-on signals. The comparator is coupled to the CDAC and configured to generate a decision signal based on the first signal and the second signal. The logic decision circuit is coupled to the CDAC and the comparator, and is configured to generate the plurality of turn-on signals and an output signal based on the decision signal. The control logic circuit is configured to receive the positive reference voltage and the negative reference voltage respectively through a first shielding layer and a second shielding layer of the CDAC, and receive the plurality of turn-on signals through a first metal layer of the CDAC. The capacitive structure is located at least in a second metal layer of the CDAC. In a vertical direction, the first shielding layer and the second shielding layer are located above the first metal layer and below the second metal layer. The vertical direction is vertical to plane directions of the first metal layer, the second metal layer, the first shielding layer and the second shielding layer.

With the CDAC, manufacturing method thereof and SAR ADC disclosed in the present disclosure, the layout of the CDAC can be configured in a three-dimensional manner, so as to reduce the total area of the CDAC and SAR ADC, and alleviate the effect on the operation of the capacitive structures caused by the circuit signals of the routing inside the CDAC, thereby improving the performance of CDAC and SAR ADC.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings.

In the present disclosure, when an element is referred to as “connected”, it may mean “electrically connected” or “optical connected”. When an element is referred to as “coupled”, it may mean “electrically coupled” or “optical coupled”. “Connected” or “coupled” can also be used to indicate that two or more components operate or interact with each other. As used in the present disclosure, the singular forms “a”, “one” and “the” are also intended to include plural forms, unless the context clearly indicates otherwise. It will be further understood that when used in this specification, the terms “comprises (comprising)” and/or “includes (including)” designate the existence of stated features, steps, operations, elements and/or components, but the existence or addition of one or more other features, steps, operations, elements, components, and/or groups thereof are not excluded.

Figure 1:
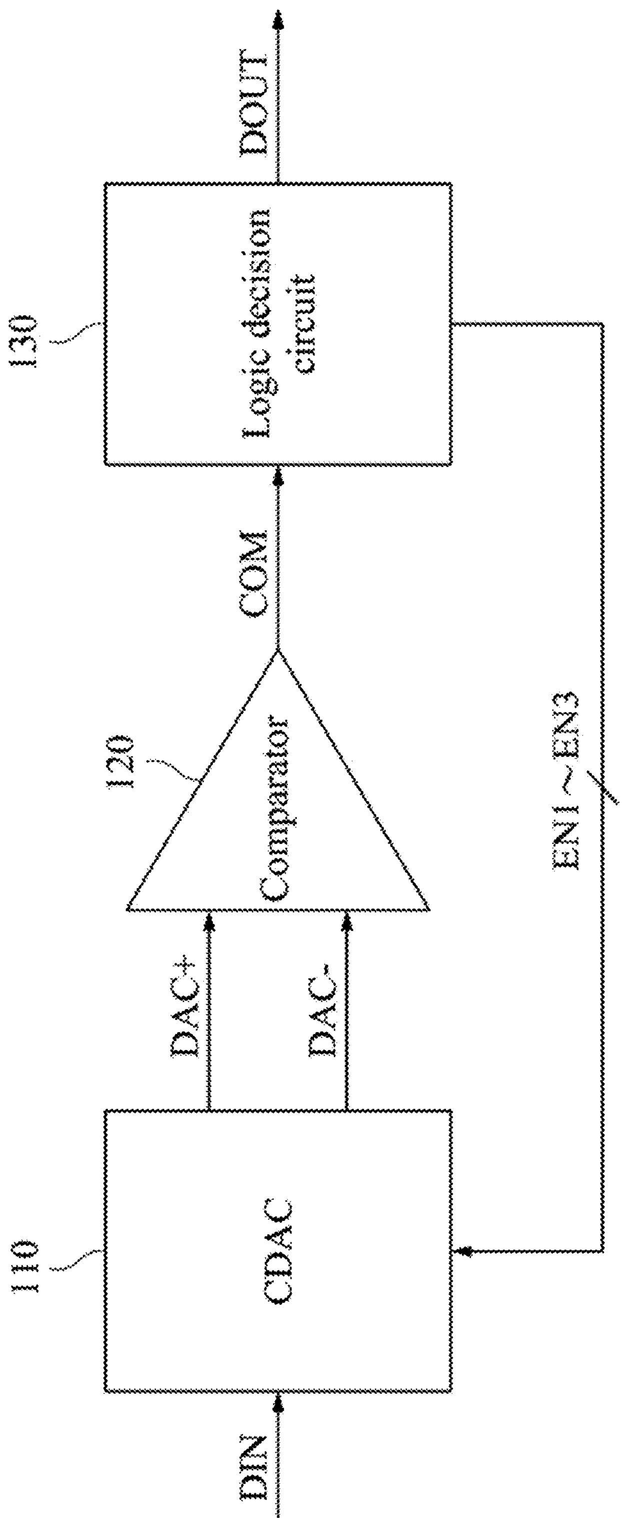
FIG. 1 is a simplified functional block diagram of a successive approximation register analog-to-digital converter (SAR ADC) in accordance with some embodiments of the present disclosure.

FIG. 1 is a simplified functional block diagram of a successive approximation register analog-to-digital converter (SAR ADC) 100 in accordance with some embodiments of the present disclosure. In some embodiments, the SAR ADC 100 comprises a capacitive digital-to-analog converter (CADC) 110, a comparator 120 and a logic decision circuit 130. The CDAC 110 is coupled to the comparator 120 and the logic decision circuit 130, and is configured to receive an input signal DIN and sample the input signal DIN, so as to generate a signal DAC+ and a signal DAC−. In addition, the CDAC 110 is further configured to receive turn-on signals EN1-EN3 from the logic decision circuit 130 and adjust the output signals DAC+ and DAC− based on the turn-on signals EN1-EN3.

The comparator 120 is coupled to the CDAC 110 and the logic decision circuit 130, and is configured to receive the signal DAC+ and the signal DAC− from the CDAC 110, generate a decision signal COM based on the signal DAC+ and the signal DAC−, and then transmit the decision signal COM to the logic decision circuit 130.

The logic decision circuit 130 is coupled to the CDAC 110 and the comparator 120, and is configured to receive the decision signal COM from the comparator 120, generate the turn-on signals EN1-EN3 to the CDAC 110 based on the decision signal COM to control the conduction status of each switch in the CDAC 110, and generate an output signal DOUT based on the decision signal COM.

It should be noted that for the sake of brevity, other components and circuits in the SAR ADC 100 are omitted. The configuration of the SAR ADC 100 in the present disclosure is only an example, and is not intended to limit the present disclosure. Other configurations of the SAR ADC are within the scope of the present disclosure.

Figure 2A:
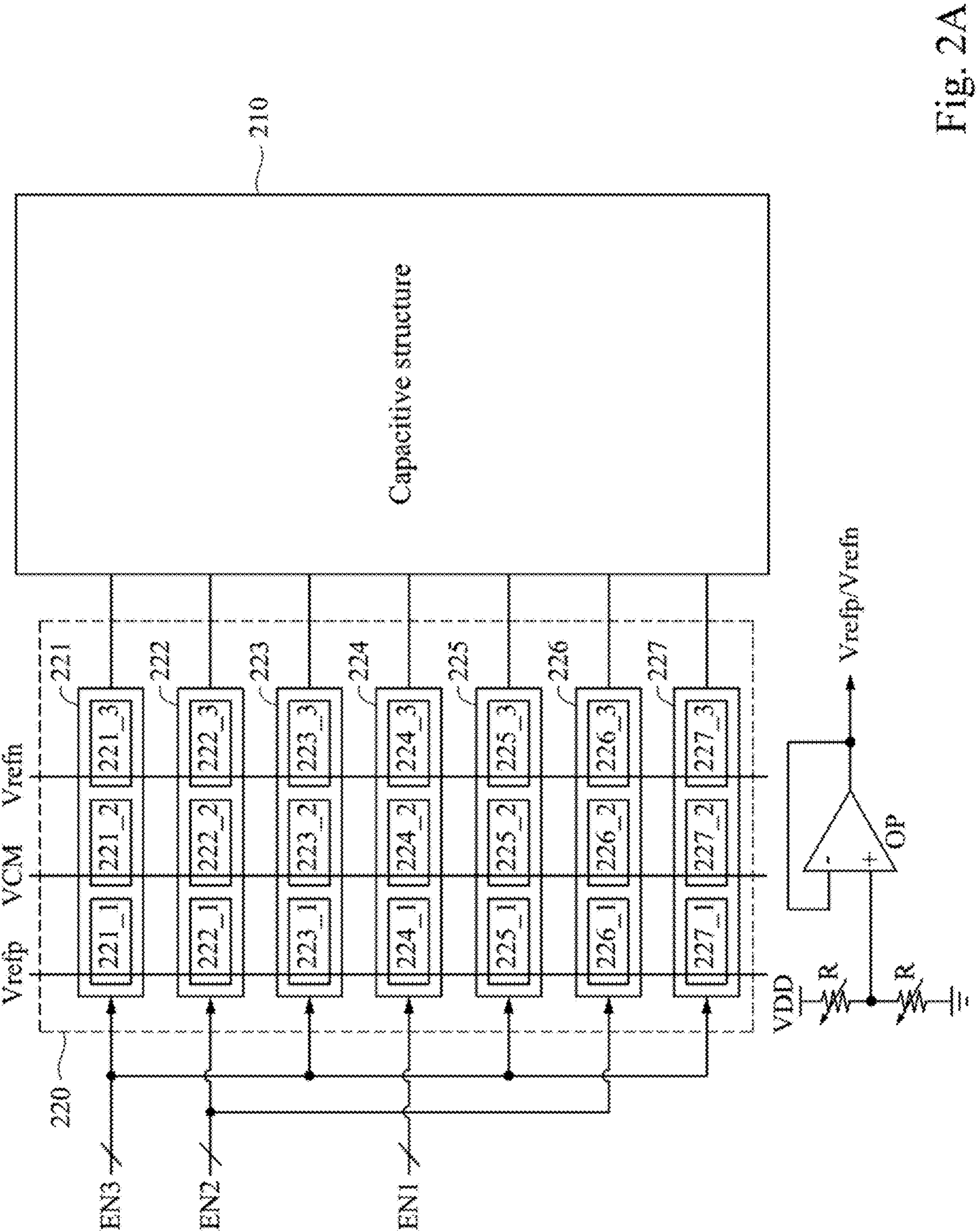
FIG. 2A is a schematic top view of a capacitive digital-to-analog converter (CDAC) in accordance with some embodiments.

In order to explain the internal structure of the CDAC 110 in detail, please further refer to FIGS. 2A-2B and FIGS. 3A-3B. FIG. 2A is a schematic top view of a CDAC 200 in accordance with some embodiments. In some embodiments, the CDAC 110 in FIG. 1 can be implemented with the CDAC 200 in FIG. 2A.

In some embodiments, the CDAC 200 comprises a capacitive structure 210 and a control logic circuit 220 coupled to each other. Two terminals of the capacitive structure 210 are configured to respectively receive a positive reference voltage Vrefp and a negative reference voltage Vrefn. The control logic circuit 220 comprises switch groups 221-227, and each of the switch groups 221-227 comprises three switch circuits. For example, the switch group 221 comprises switch circuits 221_1, 221_2 and 221_3, the switch group 222 comprises switch circuits 222_1, 222_2 and 222_3, the switch group 223 comprises switch circuits 223_1, 223_2 and 2233, and so on. The control logic circuit 220 is configured to receive the turn-on signals EN1-EN3 and adjust the conduction status of the switch circuits 221_1-227_1, 221_2-227_2 and 221_3-227_3 (hereinafter referred to as “the switch circuits 221_1-227_3”) according to the turn-on signals EN1-EN3.

Figure 2B:
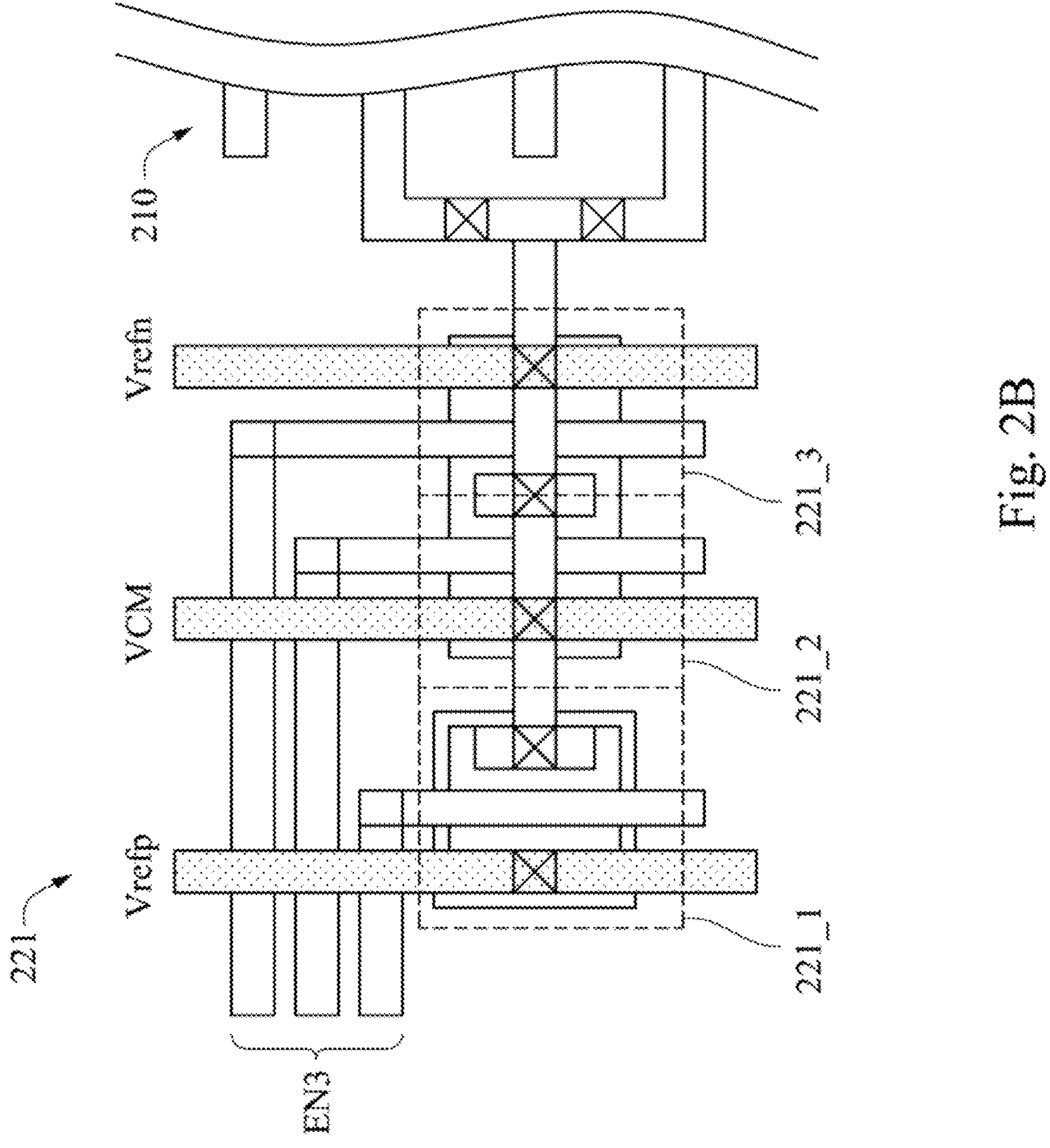
FIG. 2B is a schematic diagram of a switch group in accordance with some embodiments.

In order to explain the structure of the switch groups in detail, please refer to FIG. 2B. FIG. 2B is a schematic diagram of the switch group 221 in accordance with some embodiments. It should be noted that since the configuration and structure of the switch groups 222-227 are similar to those of the switch group 221, for the sake of brevity, the configuration and structure of the switch group 221 will be described below with reference to FIG. 2B, and the similarities and differences between the switch groups 222-227 and the switch group 221 will be described.

As shown in FIG. 2B, in some embodiments, each of the switch circuits 221_1-221_3 of the switch group 221 comprises a first terminal, a second terminal and a control terminal, wherein the first terminals of the switch circuits 221_1-221_3 are coupled to the capacitive structure 210. In some embodiments, each of the switch circuits of the switch groups 222-227 (hereinafter referred to as “the switch circuits 222_1-227_3”) also comprises a first terminal, a second terminal and a control terminal. Similar to the first terminals of the switch circuits 221_1-2213, the first terminals of the switch circuits 222_1-227_3 are also coupled to the capacitive structure 210. In some embodiments, two of the three switch circuits in each switch group may share a terminal. For example, as shown in FIG. 2B, switch circuits 221_2 and 221_3 of the switch group 221 share the second terminal.

In some embodiments, the second terminals of the switch circuits 221_1-221_3 are configured to respectively receive the positive reference voltage Vrefp, a common mode voltage VCM and the negative reference voltage Vrefn. Same as the second terminals of the switch circuits 221_1-221_3, the second terminals of the three switch circuits of each of the switch groups 222-227 are also configured to respectively receive the positive reference voltage Vrefp, the common mode voltage VCM and the negative reference voltage Vrefn.

In other words, for the switch circuits 221_1-227_3, the second terminals of the switch circuits 221_1, 222_1, . . . , 227_1 with the index number "1" receive the positive reference voltage Vrefp, the second terminals of the switch circuits 221_2, 222_2, . . . , 227_2 with the index number "2" receive the common mode voltage VCM, and the second terminals of the switch circuits 221_3, 222_3, . . . , 227_3 with the index number "3" receive the negative reference voltage Vrefn. In some embodiments, the common mode voltage VCM, the positive reference voltage Vrefp and the negative reference voltage Vrefn are different from each other.

In some embodiments, the control terminals of the switch circuits 221_1-221_3 of the switch group 221 are configured to receive the turn-on signal EN3, so as to determine whether the switch circuits 221_1-221_3 are turned on or turned off. The control terminals of the switch circuits of the switch groups 222-227 are configured to receive the turn-on signal EN1, EN2 or EN3, instead of all receiving the turn-on signals EN3.

As shown in FIG. 2A, the control terminals of the switch circuits of the switch group 221 are configured to receive the turn-on signal EN3, and the control terminals of the switch circuits of the switch groups 223, 225 and 227 are also configured to receive the turn-on signal EN3. On the other hand, the control terminals of the switch circuits of the switch group 224 are configured to receive the turn-on signal EN1, and the control terminals of the switch circuits of the switch groups 222 and 226 are configured to receive the turn-on signal EN2.

In some embodiments, each of the turn-on signals EN1-EN3 is a multi-bit (e.g., 3-bit) signal, wherein each bit is configured to control the conduction status of each switch circuit of the switch group. For example, the first bit of the turn-on signal EN3 can control the conduction status of the switch circuit 221_1, the second bit of the turn-on signal EN3 can control the conduction status of the switch circuit 221_2, and the third bit of the turn-on signal EN3 can control the conduction status of the switch circuit 221_3.

In addition, the switch circuits of the switch groups 221-227 that receive the same voltage (i.e., the positive reference voltage Vrefp, the common mode voltage VCM or the negative reference voltage Vrefn) and are controlled by the same turn-on signal (i.e., the turn-on signal EN1, EN2 or EN3) will be turned on or turned off synchronously.

Specifically, the switch group 224 receives the turn-on signal EN1, so one of the switch circuits 224_1-224_3 is turned on, and the other two are turned off. The switch groups 222 and 226 are controlled by the turn-on signal EN2, so the switch circuits 222_1 and 2261 that jointly receive the positive reference voltage Vrefp are turned on or turned off synchronously, the switch circuits 222_2 and 226_2 that jointly receive the common mode voltage VCM are turned on or turned off synchronously, and the switch circuits 222_3 and 226_3 that jointly receive the negative reference voltage Vrefn are turned on or turned off synchronously. The switch groups 221, 223, 225 and 227 are controlled by the turn-on signal EN3, so the switch circuits 221_1, 223_1, 225_1 and 227_1 that jointly receive the positive reference voltage Vrefp are turned on or turned off synchronously, the switch circuits 221_2, 2232, 225_2 and 227_2 that jointly receive the common mode voltage VCM are turned on or turned off synchronously, and the switch circuits 2213, 2233, 225_3 and 227_3 that jointly receive the negative reference voltage Vrefn are turned on or turned off synchronously.

As can be seen from the above, in some embodiments, the switch circuits of N of the switch groups 221-227 receiving the same voltage (i.e., the positive reference voltage Vrefp, the common mode voltage VCM or the negative reference voltage Vrefn) will be turned on or turned off synchronously, other 2N of the switch groups 221-227 receiving the same voltage will be turned on or turned off synchronously, and yet other 4N of the switch groups 221-227 receiving the same voltage will be turned on or turned off synchronously, wherein N is a positive integer.

It should be noted that the numbers of the switch groups and the switch circuits in the present disclosure are only examples, and are not intended to limit the present disclosure. Other numbers of the switch groups and the switch circuits are within the scope of the present disclosure. In some embodiments, each switch group comprises only two switch circuits. In other embodiments, each switch group comprises more than three switch circuits.

It should be noted that the positive reference voltage Vrefp and the negative reference voltage Vrefn in FIG. 2A (and FIG. 3A explained below) are shown as be generated by a source voltage VDD passing through a plurality of variable resistors R and an operational amplifier OP, but the present disclosure is not limited to this. The positive reference voltage Vrefp and the negative reference voltage Vrefn in the present disclosure are not limited to being generated by using resistors to divide the voltage or making current flow through resistors, nor are they limited to being generated by using operational amplifiers. In addition, it should be noted that the positive reference voltage Vrefp and the negative reference voltage Vrefn are generated by different circuits. For example, the circuit that generates the positive reference voltage Vrefp and the circuit that generates the negative reference voltage Vrefn comprise different variable resistors and/or different operational amplifiers.

In the embodiment of FIG. 2A, the capacitive structure 210, the conductive lines connecting the capacitive structure 210 and the control logic circuit 220, and the conductive lines configured to transmit the turn-on signals EN1-EN3 are located in the same metal layer of the CDAC 200, so the total area of the CDAC 200 is at least equal to the sum of the area of the capacitive structure 210, the area of the conductive lines connecting the capacitive structure 210 and the control logic circuit 220, and the area of the conductive lines configured to transmit the turn-on signals EN1-EN3. Moreover, the circuit signals in the conductive lines connecting the capacitive structure 210 and the control logic circuit 220 may also affect the operation of the capacitive structure 210. Other implementations of the CDAC 110 in FIG. 1 will be detailed below.

Figure 3A:
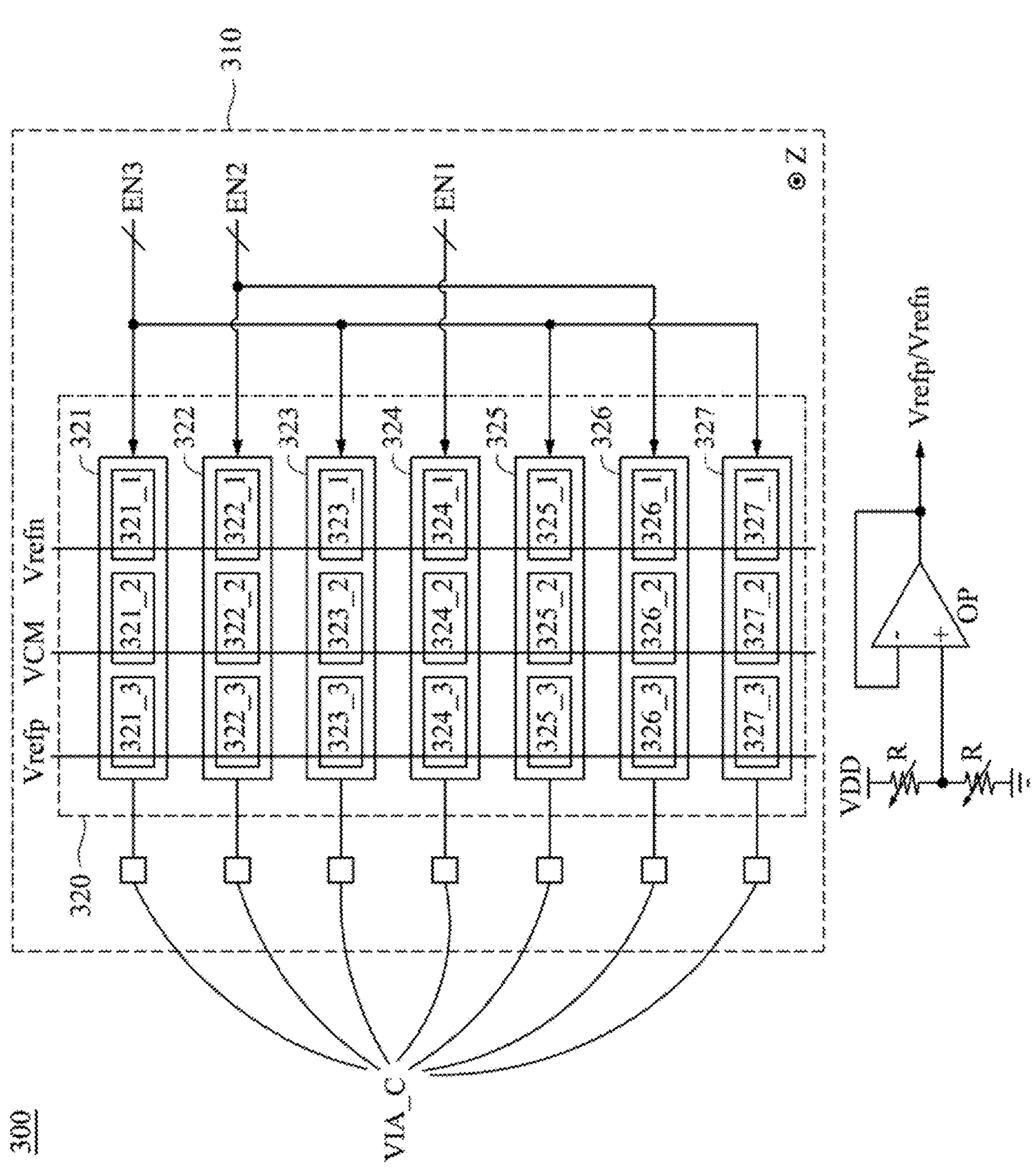
FIG. 3A is a schematic top view of a CDAC in accordance with some embodiments of the present disclosure.

FIG. 3A is a schematic top view of a CDAC 300 in accordance with some embodiments of the present disclosure. In some embodiments, the CDAC 110 in FIG. 1 can be implemented with the CDAC 300 in FIG. 3A.

The operation of the CDAC 300 in FIG. 3A is similar to the CDAC 200 in FIG. 2A. In other words, the configuration and operation of the switch group 321 are similar to the switch group 221 in FIG. 2B, the configuration and operation of the switch group 322 are similar to the switch group 222, and so on. Therefore, the configurations and operations of the switch circuits 321_1-327_3 in the CDAC 300 are also similar to the switch circuits 221_1-227_3 in the CDAC 200. However, the arrangement between the capacitive structure 310 and the control logic circuit 320 in the CDAC 300 is different from the arrangement between the capacitive structure 210 and the control logic circuit 220 in the CDAC 200. For the sake of brevity, only the differences will be explained below.

In the embodiment of FIG. 3A, in a direction Z, the capacitive structure 310 is located above the control logic circuit 320 and the conductive lines used to transmit the turn-on signals EN1-EN3, and thus the capacitive structure 310 is illustrated as dotted lines, wherein the direction Z is the direction vertical to the plurality of metal layers in the CDAC 300. Therefore, the total area of the CDAC 300 is only at least equal to the area of the capacitive structure 310, so the total area of the CDAC 300 can be smaller than the total area of the CDAC 200.

The control logic circuit 320 receives the turn-on signals EN1-EN3 in a configuration similar to the control logic circuit 220 and controls the conduction status of the switch circuits 321_1-327_3. Different from the control logic circuit 220, the control logic circuit 320 is coupled to the capacitive structure 310 through a plurality of vias VIA_C instead of conductive lines, so the effect on the operation of the capacitive structure 310 caused by the circuit signals can be alleviated.

Figure 3B:
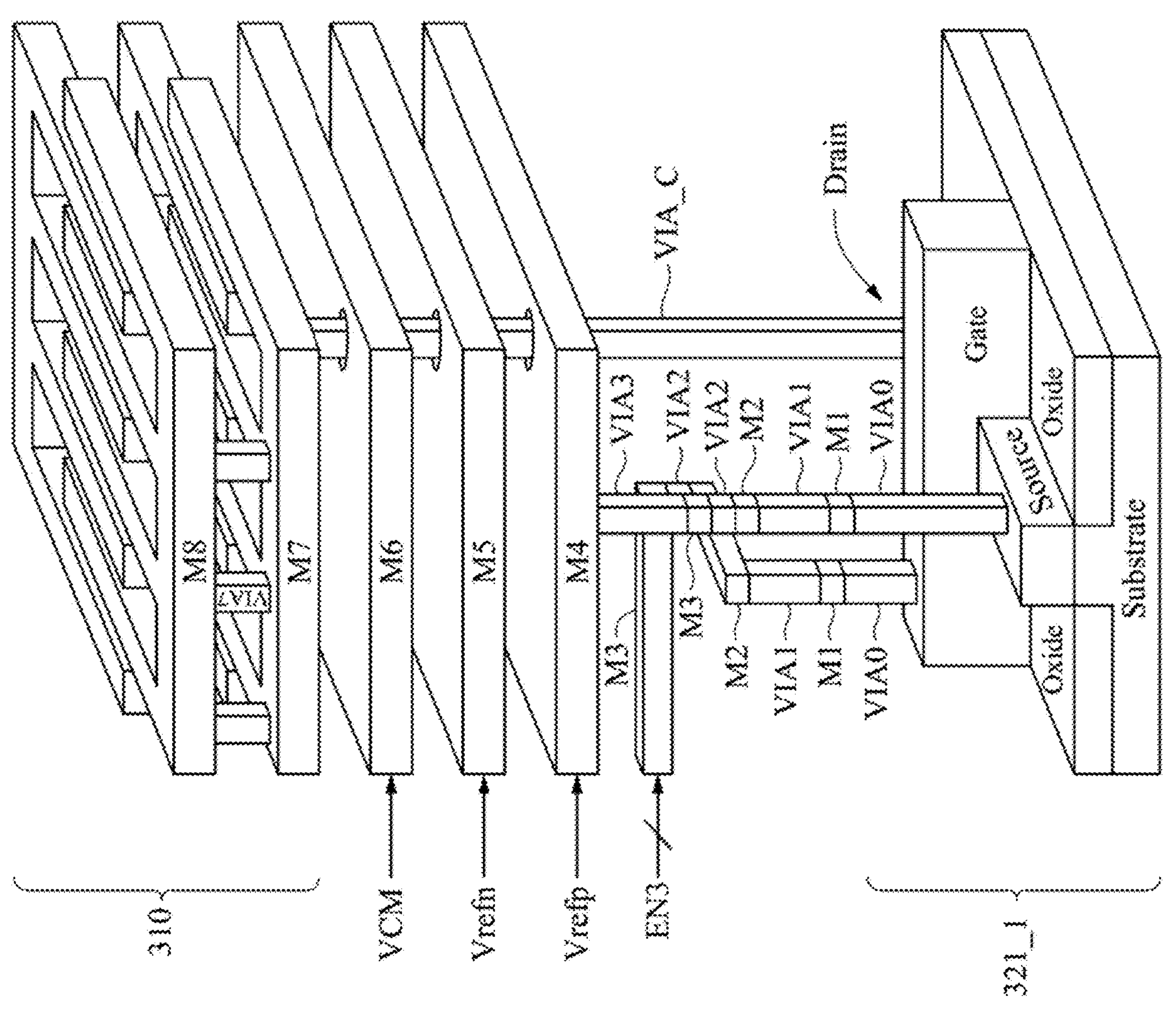
FIG. 3B is a three-dimensional schematic diagram of a part of the CDAC in accordance with some embodiments of the present disclosure.

In order to clearly illustrate the structure of the CDAC 300, please further refer to FIG. 3B. FIG. 3B is a three-dimensional schematic diagram of a part of the CDAC 300 in accordance with some embodiments of the present disclosure. The connections of the switch circuits 321_1-327_3 are similar to each other. For example, the turn-on signals EN1-EN3 are transmitted to the switch circuits 321_1-3273 through a metal layer M3, the positive reference voltage Vrefp is transmitted to the switch circuits 321_1-327_3 through a metal layer M4 of the CDAC 300, the negative reference voltage Vrefn is transmitted to the switch circuits 321_1-327_3 through a metal layer M5 of the CDAC 300, and the common mode voltage VCM is transmitted to the switch circuits 321_1-327_3 through a metal layer M6 of the CDAC 300. Therefore, for the sake of brevity, the switch circuits 321_2-327_3 are omitted in FIG. 3B.

In some embodiments, the first terminal (e.g., source terminal) of the switch circuit 321_1 passes through the metal layers M1-M3 of the CDAC 300 through vias VIA0-VIA3 and is connected to the metal layer M4, so as to receive the positive reference voltage Vrefp through the metal layer M4; the second terminal (e.g., drain terminal) of the switch circuit 321_1 passes through the metal layers M1-M5 through the via VIA_C and is coupled to the capacitive structure 310; the control terminal (e.g., gate terminal) of the switch circuit 321_1 is coupled to the metal layer M2 through other vias VIA0 and VIA1, and then is coupled to the metal layer M3 through another via VIA2, so as to receive the turn-on signal EN3.

In some embodiments, the capacitive structure 310 is located in a metal layer M7 of the CDAC 300. In addition, in the direction Z, the metal layer M7 is located above the metal layers M4-M6, and the metal layers M4-M6 are located above the metal layers M1-M3. In other words, the CDAC 300 can be implemented as a three-dimensional layout in which the circuit structures (i.e., the capacitive structure and the control logic circuit 320) are arranged in different metal layers.

In some embodiments, the metal layers M4-M6 are used as shielding layers between the metal layers M3 and M7 to shield the capacitive structure 310 and the control logic circuit 320, so as to prevent circuit signals in the control logic circuit 320 from interfering with the operations of the capacitive structure 310. It should be noted that although the positive reference voltage Vrefp, the negative reference voltage Vrepn and the common mode voltage VCM in FIG. 3B are illustrated as being transmitted through the metal layers M4-M6 respectively, the present disclosure is not limited to this. Any two of the positive reference voltage Vrefp, the negative reference voltage Vrepn and the common mode voltage VCM can interchange the metal layers they pass through. For example, the positive reference voltage Vrefp can change to be transmitted through the metal layer M6, and the common mode voltage VCM can change to be transmitted through the metal layer M4.

In some embodiments, the CDAC 300 comprises more than three metal layers (e.g., the metal layers M4-M6 and additional metal layers (not shown)) between the metal layers M3 and M7, each of these metal layers is coupled to the positive reference voltage Vrefp, the common mode voltage VCM or the negative reference voltage Vrefn, so as to jointly act as shielding layers between the metal layers M3 and M7.

As shown in FIG. 3B, in some embodiments, the capacitive structure 310 can be located in the metal layers M7 and M8 of the CDAC 300 at the same time, wherein the metal layer M8 is located above the metal layer M7 in the direction Z, and the metal layers M7 and M8 are connected through the via VIA7. In other words, the capacitive structure 310 can be located in multiple metal layers of the CDAC 300.

It should be noted that although the capacitive structure 310 in FIG. 3B is illustrated as a metal-oxide-metal (MOM) capacitive structure, the present disclosure is not limited to this. The capacitive structures 210 and 310 in the present disclosure can be implemented with a MOM capacitive structure, a metal-insulator-metal (MIM) capacitive structure, other capacitive structures or their combinations.

It should be noted that although the switch circuit 321_1 in FIG. 3B is illustrated as a metal oxide semiconductor (MOS) transistor that can be an N-type transistor or a P-type transistor, the present disclosure is not limited to this. The switch circuits 221_1-227_3 and 321_1-327_3 in the present disclosure can be implemented with switches, inverters, buffers, latches, other similar circuits or their combinations.

In addition, in some embodiments, the switch circuits 321_2327_2 (i.e., the switch circuits with the index number "2") can be omitted, and the metal layer M6 (i.e., the metal layer receiving the common mode voltage VCM) can be omitted.

Figure 4:
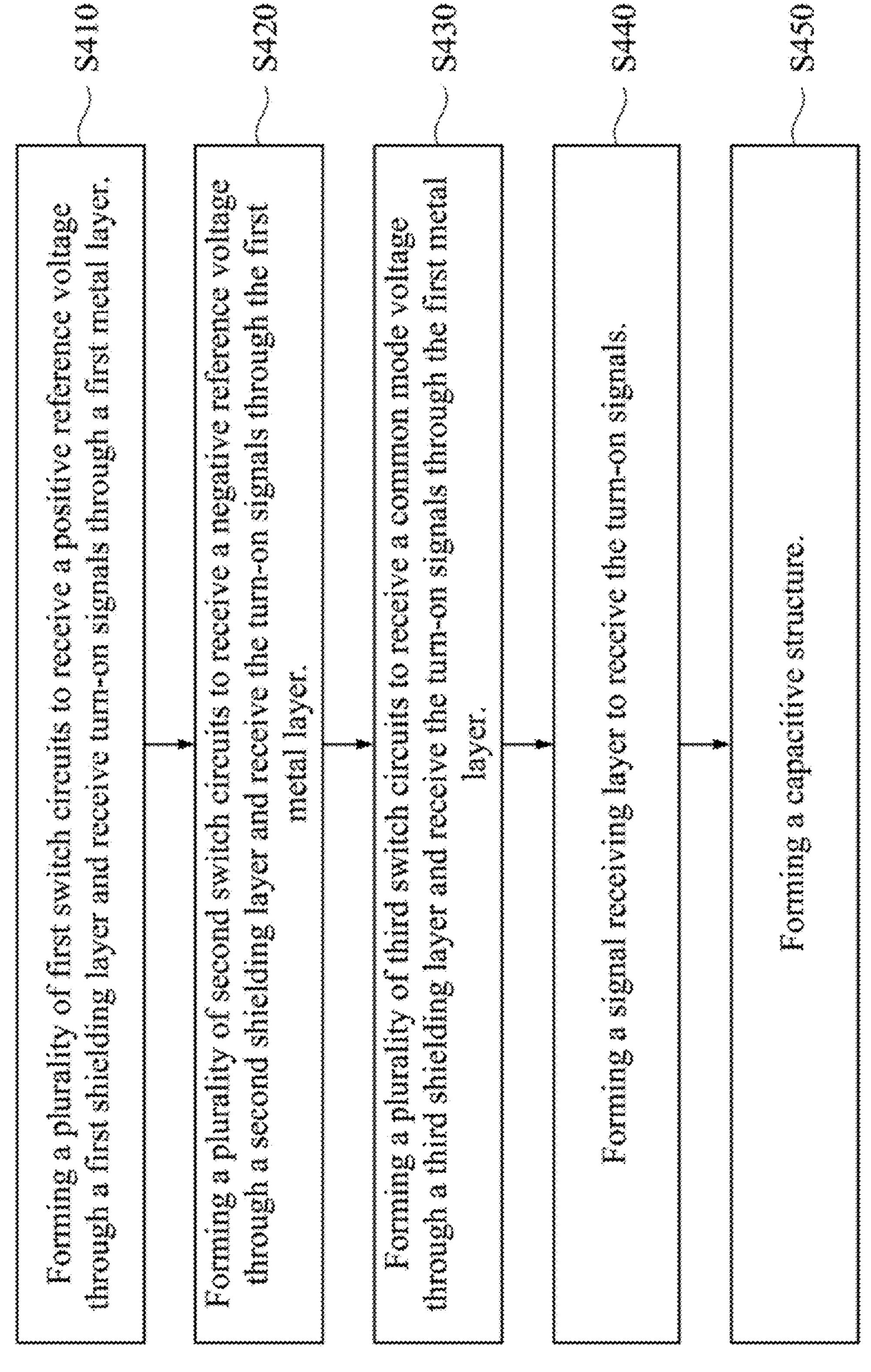
FIG. 4 is a flowchart of a manufacturing method of the CDAC in accordance with some embodiments of the present disclosure.

FIG. 4 is a flowchart of a manufacturing method 400 of the CDAC in accordance with some embodiments of the present disclosure. In some embodiments, the manufacturing method 400 comprises steps S410, S420, S430, S440 and S450.

In step S410, a plurality of first switch circuits (e.g., the switch circuits 321_1-327_1) are formed, wherein the first terminal (e.g., source terminal) of each first switch circuit receives a positive reference voltage (e.g., the positive reference voltage Vrefp) through a first shielding layer (e.g., the metal layer M4) of the CDAC, and the control terminal (e.g., gate terminal) of each first switch circuit receives a plurality of turn-on signals (e.g., the turn-on signals EN1-EN3) through a first metal layer (e.g., the metal layer M3) of the CDAC.

In step S420, a plurality of second switch circuits (e.g., the switch circuits 321_3-327_3) are formed, wherein the first terminal (e.g., source terminal) of each second switch circuit is coupled to a negative reference voltage (e.g., the negative reference voltage Vrefn) through a second shielding layer (e.g., the metal layer M5) of the CDAC, and the control terminal (e.g., gate terminal) of each second switch circuit receives the plurality of turn-on signals through the first metal layer of the CDAC.

In step S430, a plurality of third switch circuits (e.g., the switch circuits 321_2-327_2) are formed, wherein the first terminal (e.g., source terminal) of each third switch circuit is coupled to a common mode voltage (e.g., the common mode voltage VCM) through a third shielding layer (e.g., the metal layer M6) of the CDAC, and the control terminal (e.g., gate terminal) of each third switch circuit receives the plurality of turn-on signals through the first metal layer of the CDAC, wherein the common mode voltage, the positive reference voltage and the negative reference voltage are different from each other.

In step S440, a signal receiving layer (e.g., the metal layer M3) is formed to receive the plurality of turn-on signals from an external circuit (e.g., the logic decision circuit 130) and transmit the plurality of turn-on signals to the first metal layer.

In step S450, a capacitive structure (e.g., the capacitive structure 310) is formed, wherein the capacitive structure is located at least in a second metal layer (e.g., the metal layer M7) of the CDAC and is coupled to a plurality of second terminals (e.g., drain terminals) of the plurality of first switch circuits, the plurality of second switch circuits and the plurality of third switch circuits.

In the embodiments of the manufacturing method 400, in a vertical direction (e.g., the direction Z), the second metal layer is located above the first metal layer, the first shielding layer, the second shielding layer, the third shielding layer and the signal receiving layer. The first shielding layer, the second shielding layer and the third shielding layer are located above the first metal layer and the signal receiving layer. The signal receiving layer is located above the first metal layer. The aforementioned vertical direction is vertical to plane directions of the first metal layer, the second metal layer, the first shielding layer, the second shielding layer, the third shielding layer and the signal receiving layer.

It should be noted that the number and order of steps in the manufacturing method 400 of the present disclosure are only examples, and are not intended to limit the present disclosure. Other numbers and orders of steps are within the scope of the present disclosure. In some embodiments, step S430 can be omitted.

Through the SAR ADC, CDAC and manufacturing method of the present disclosure, the CDAC in the SAR ADC can be configured in a three-dimensional layout. In addition to reducing the total area of the SAR ADC, the effect on the operation of the capacitive structures caused by the routing inside the CDAC also can be alleviated.

The above are preferred embodiments of the present disclosure. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A capacitive digital-to-analog converter (CDAC), comprising:

a capacitive structure, wherein two terminals of the capacitive structure are configured to respectively receive a positive reference voltage and a negative reference voltage; and a control logic circuit, coupled to the capacitive structure and comprising a plurality of switch groups, wherein each of the plurality of switch groups comprises a first switch circuit and a second switch circuit, and each of the first switch circuit and the second switch circuit comprises:

a first terminal, wherein the first terminal of the first switch circuit is configured to receive the positive reference voltage through a first shielding layer of the CDAC, the first terminal of the second switch circuit is configured to receive the negative reference voltage through a second shielding layer of the CDAC;

a second terminal, configured to be coupled to the capacitive structure; and a control terminal, configured to receive one of a plurality of turn-on signals through a first metal layer of the CDAC, wherein the capacitive structure is located at least in a second metal layer of the CDAC, and in a vertical direction, the first shielding layer and the second shielding layer are located above the first metal layer and below the second metal layer, wherein the vertical direction is vertical to plane directions of the first metal layer, the second metal layer, the first shielding layer and the second shielding layer.

2. The CDAC of claim 1, wherein each of the plurality of switch groups further comprises a third switch circuit, and the third switch circuit comprises:

a first terminal, configured to receive a common mode voltage, wherein the common mode voltage, the positive reference voltage and the negative reference voltage are different from each other;

a second terminal, configured to be coupled to the capacitive structure; and a control terminal, configured to receive another of the plurality of turn-on signals through the first metal layer.

3. The CDAC of claim 2, further comprising:

a third shielding layer, coupled to the first terminal of the third switch circuit, and configured to receive the common mode voltage and shield the capacitive structure and the control logic circuit, wherein in the vertical direction, the third shielding layer is located between the first metal layer and the second metal layer.

4. The CDAC of claim 2, wherein one of the first switch circuit, the second switch circuit and the third switch circuit of each of the plurality of switch groups is turned on according to the plurality of turn-on signals, and the other two of the first switch circuit, the second switch circuit and the third switch circuit are turned off according to the plurality of turn-on signals.

5. The CDAC of claim 4, wherein

N first switch circuits of N of the plurality of switch groups are turned on or turned off synchronously, N second switch circuits of the N of the plurality of switch groups are turned on or turned off synchronously, and N third switch circuits of the N of the plurality of switch groups are turned on or turned off synchronously;

other 2N first switch circuits of 2N of the plurality of switch groups are turned on or turned off synchronously, other 2N second switch circuits of the 2N of the plurality of switch groups are turned on or turned off synchronously, and other 2N third switch circuits of the 2N of the plurality of switch groups are turned on or turned off synchronously; and yet other 4N first switch circuits of 4N of the plurality of switch groups are turned on or turned off synchronously, yet other 4N second switch circuits of the 4N of the plurality of switch groups are turned on or turned off synchronously, and yet other 4N third switch circuits of the 4N of the plurality of switch groups are turned on or turned off synchronously, wherein N is a positive integer.

6. The CDAC of claim 1, further comprising a first via extending along the vertical direction, wherein the second terminals of the first switch circuit and the second switch circuit are coupled to the capacitive structure through the first via.

7. The CDAC of claim 6, wherein the capacitive structure is located in the second metal layer and a third metal layer of the CDAC, wherein in the vertical direction, the third metal layer is located above the second metal layer, and the second metal layer and the third metal layer are coupled to each other through a second via extending along the vertical direction.

8. The CDAC of claim 1, further comprising a signal receiving layer and a third via, wherein in the vertical direction, the signal receiving layer is located above the first metal layer and coupled to the first metal layer through the third via, and is configured to receive the plurality of turn-on signals from an external circuit and transmit the plurality of turn-on signals to the first metal layer through the third via.

9. A manufacturing method for manufacturing a capacitive digital-to-analog converter (CDAC), comprising:

forming a control logic circuit comprising a plurality of switch groups, comprising:

forming a plurality of first switch circuits, wherein a first terminal of each of the plurality of first switch circuits is configured to receive a positive reference voltage through a first shielding layer of the CDAC, and a control terminal of each of the plurality of first switch circuits is configured to receive one of a plurality of turn-on signals through a first metal layer of the CDAC; and forming a plurality of second switch circuits, wherein a first terminal of each of the plurality of second switch circuits is configured to receive a negative reference voltage through a second shielding layer of the CDAC, and a control terminal of each of the plurality of second switch circuits is configured to receive another of the plurality of turn-on signals through the first metal layer; and forming a capacitive structure, wherein the capacitive structure is located at least in a second metal layer of the CDAC and coupled to a plurality of second terminals of the plurality of first switch circuits and the plurality of second switch circuits, wherein two terminals of the capacitive structure are configured to respectively receive the positive reference voltage and the negative reference voltage, wherein in a vertical direction, the first shielding layer and the second shielding layer are located above the first metal layer and below the second metal layer, and the vertical direction is vertical to plane directions of the first metal layer, the second metal layer, the first shielding layer and the second shielding layer.

10. The manufacturing method of claim 9, wherein forming the control logic circuit comprising the plurality of switch groups further comprises:

forming a plurality of third switch circuits, wherein a first terminal of each of the plurality of third switch circuits is configured to receive a common mode voltage through a third shielding layer, a second terminal of each of the plurality of third switch circuits is coupled to the capacitive structure, and a control terminal of each of the plurality of third switch circuits is configured to receive yet another of the plurality of turn-on signals through the first metal layer, wherein the third shielding layer is located between the first metal layer and the second metal layer, and the common mode voltage, the positive reference voltage and the negative reference voltage are different from each other.

11. The manufacturing method of claim 9, wherein forming the capacitive structure comprises:

forming the capacitive structure in the second metal layer and a third metal layer of the CDAC, wherein in the vertical direction, the third metal layer is located above the second metal layer, and the second metal layer and the third metal layer are coupled to each other through a via extending along the vertical direction.

12. The manufacturing method of claim 9, further comprising:

forming a signal receiving layer, so as to receive the plurality of turn-on signals form an external circuit and transmit the plurality of turn-on signals to the second metal layer, wherein in the vertical direction, the signal receiving layer is located above the second metal layer and coupled to the second metal layer through a via extending along the vertical direction.

13. A successive approximation register analog-to-digital converter (SAR ADC), comprising:

a capacitive digital-to-analog converter (CDAC), comprising a capacitive structure and a control logic circuit coupled to each other, wherein two terminals of the capacitive structure are configured to respectively receive a positive reference voltage and a negative reference voltage for sampling an input signal and generating a first signal and a second signal, and the control logic circuit is configured to adjust the first signal and the second signal based on a plurality of turn-on signals;

a comparator, coupled to the CDAC and configured to generate a decision signal based on the first signal and the second signal; and a logic decision circuit, coupled to the CDAC and the comparator, and configured to generate the plurality of turn-on signals and an output signal based on the decision signal, wherein the control logic circuit is configured to receive the positive reference voltage and the negative reference voltage respectively through a first shielding layer and a second shielding layer of the CDAC, and receive the plurality of turn-on signals through a first metal layer of the CDAC, the capacitive structure is located at least in a second metal layer of the CDAC, and in a vertical direction, the first shielding layer and the second shielding layer are located above the first metal layer and below the second metal layer, wherein the vertical direction is vertical to plane directions of the first metal layer, the second metal layer, the first shielding layer and the second shielding layer.

14. The SAR ADC of claim 13, wherein the logic decision circuit is further configured to receive a common mode voltage, wherein the common mode voltage, the positive reference voltage and the negative reference voltage are different from each other.

15. The SAR ADC of claim 14, wherein the CDAC further comprises a third shielding layer, the third shielding layer is configured to receive the common mode voltage and shield the capacitive structure and the control logic circuit, wherein in the vertical direction, the third shielding layer is located between the first metal layer and the second metal layer.

16. The SAR ADC of claim 14, wherein the logic decision circuit comprises a plurality of switch groups, each of the plurality of switch groups comprises a first switch circuit configured to receive the positive reference voltage, a second switch circuit configured to receive the negative reference voltage, and a third switch circuit configured to receive the common mode voltage, wherein one of the first switch circuit, the second switch circuit and the third switch circuit of each of the plurality of switch groups is turned on according to the plurality of turn-on signals, and the other two of the first switch circuit, the second switch circuit and the third switch circuit are turned off according to the plurality of turn-on signals.

17. The SAR ADC of claim 16, wherein

N first switch circuits of N of the plurality of switch groups are turned on or turned off synchronously, N second switch circuits of the N of the plurality of switch groups are turned on or turned off synchronously, and N third switch circuits of the N of the plurality of switch groups are turned on or turned off synchronously;

other 2N first switch circuits of 2N of the plurality of switch groups are turned on or turned off synchronously, other 2N second switch circuits of the 2N of the plurality of switch groups are turned on or turned off synchronously, and other 2N third switch circuits of the 2N of the plurality of switch groups are turned on or turned off synchronously; and yet other 4N first switch circuits of 4N of the plurality of switch groups are turned on or turned off synchronously, yet other 4N second switch circuits of the 4N of the plurality of switch groups are turned on or turned off synchronously, and yet other 4N third switch circuits of the 4N of the plurality of switch groups are turned on or turned off synchronously, wherein N is a positive integer.

18. The SAR ADC of claim 13, wherein the CDAC further comprises a first via extending along the vertical direction, wherein the control logic circuit is coupled to the capacitive structure through the first via.

19. The SAR ADC of claim 18, wherein the capacitive structure is located in the second metal layer and a third metal layer of the CDAC, wherein in the vertical direction, the third metal layer is located above the second metal layer, and the second metal layer and the third metal layer are coupled to each other through a second via extending along the vertical direction.

20. The SAR ADC of claim 13, wherein the CDAC further comprises a signal receiving layer and a third via, wherein in the vertical direction, the signal receiving layer is located above the first metal layer and coupled to the first metal layer through the third via, and is configured to receive the plurality of turn-on signals from the logic decision circuit and transmit the plurality of turn-on signals to the first metal layer through the third via.

* * * * *